United States Patent [19]

Frohlich

[11] Patent Number: 4,525,644
[45] Date of Patent: Jun. 25, 1985

[54] PIEZOELECTRIC-ENHANCED CIRCUIT CONNECTION MEANS

[76] Inventor: Sigurd Frohlich, 4141 Mariposa, Santa Barbara, Calif. 93110

[21] Appl. No.: 597,916

[22] Filed: Apr. 9, 1984

[51] Int. Cl.³ .............................................. H01L 41/08
[52] U.S. Cl. .................... 310/328; 310/311; 310/330; 339/17 R; 339/126 RS; 200/251
[58] Field of Search ........ 310/328, 330-332; 361/413; 339/17 R, 17 LC, 30, 126 RS, 128, DIG. 1; 200/250, 251, 181

[56] References Cited

U.S. PATENT DOCUMENTS

| | | | |
|---|---|---|---|
| 2,740,942 | 4/1956 | Sprigg | 339/30 |
| 2,916,578 | 12/1959 | Crownover | 310/328 X |
| 2,988,723 | 6/1961 | Archer | 339/30 |
| 3,390,559 | 7/1968 | Steutzer | 310/328 X |
| 3,405,289 | 10/1968 | Gikow | 310/328 |
| 3,473,466 | 10/1969 | Thayer | 310/328 X |
| 3,611,577 | 10/1971 | Smith | 310/328 X |
| 3,684,904 | 8/1972 | Galutva et al. | 310/328 |
| 3,861,030 | 1/1975 | Otte et al. | 339/30 X |
| 4,219,755 | 8/1980 | O'Neill | 310/328 |
| 4,454,442 | 6/1984 | Hosking | 310/328 |

Primary Examiner—Mark O. Budd
Attorney, Agent, or Firm—Leonard Tachner

[57] ABSTRACT

Materials exhibiting electrostrictive characteristics, such as piezoelectric materials, are used to selectively increase the mechanical engagement forces between two electrical connections for improving the integrity and reliability of their interconnection. In one illustrative embodiment, a piezoelectric layer is located beneath each connection pad of a printed circuit board and separated therefrom by a layer of dielectric material. The respective piezoelectric layers are commonly connected to a source of voltage for selectively increasing their geometric dimension thereby also increasing the force of engagement between the connection pads and a suitable connector.

5 Claims, 5 Drawing Figures

U.S. Patent  Jun. 25, 1985  4,525,644
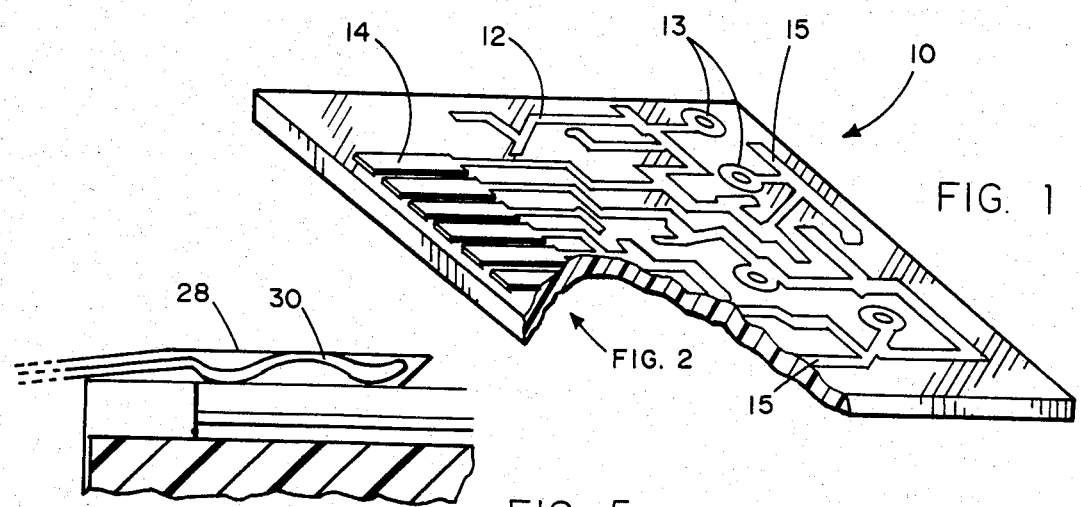
FIG. 1
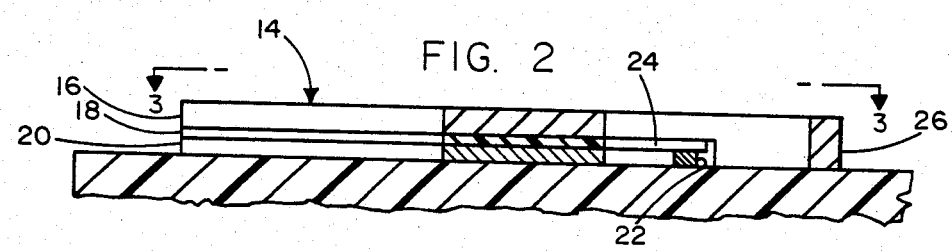
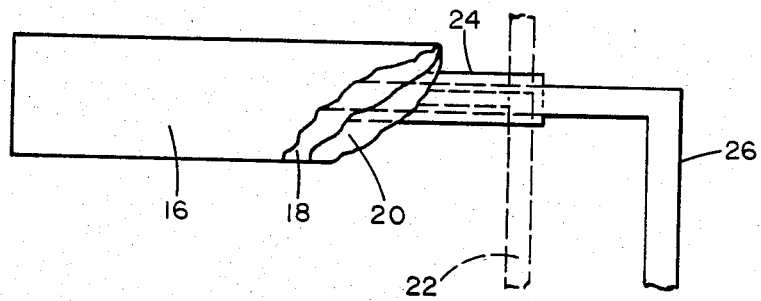
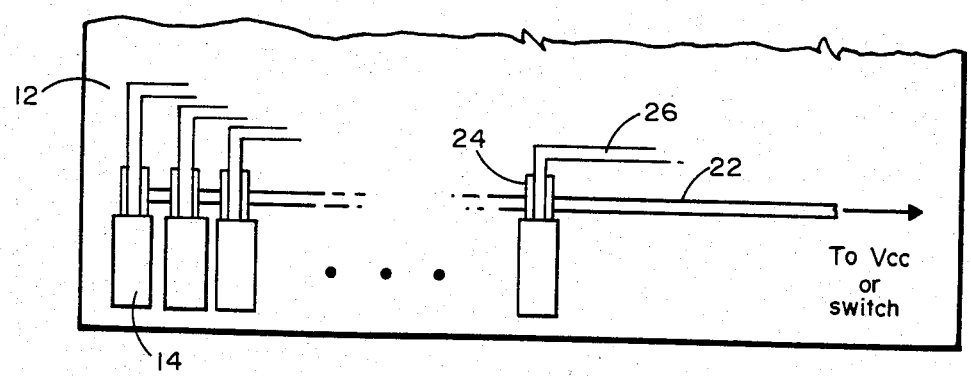

PIEZOELECTRIC-ENHANCED CIRCUIT CONNECTION MEANS

BACKGROUND OF THE INVENTION

1. Field of the Invention

The present invention relates generally to the field of electrical circuit connections and more specifically to electrical connectors such as those used primarily on printed circuit boards for interconnecting such circuit boards with other components of an electrical circuit.

2. Prior Art

It is believed that the present invention is profoundly unique. It involves the use of piezoelectric materials to mechanically enhance the electrical circuit connection of devices such as printed circuit boards and mating connectors. An examination of the prior art has failed to show any prior issued U.S. patents which involve the use of piezoelectric materials to mechanically enhance electrical circuit interconnections. The only prior art which is deemed to be of merely general interest is a Russian Inventor's Certificate No. 637,901 issued in 1978. This Inventor's Certificate discloses a contact structure which includes a sleeve designed to expand upon overheating of the connection due to the high resistance. The expansion serves to increase the contact pressure. However, the sleeve is not of a piezoelectric material but rather of a polyamide resin material. Furthermore, the expansion of the sleeve is not controllable but is due entirely to overheating. On the other hand, the present invention involves a novel contact structure in which mechanical expansion of a piezoelectric coating, as a result of a selectively applied voltage thereto, increases the integrity of an electrical connection. The applicant knows of no more relevant prior art in the form of issued patents or otherwise.

SUMMARY OF THE INVENTION

Because of the lack of relevant prior art, the present invention may be summarized broadly as any electrical interconnection which involves the use of electrostrictive coatings to which a voltage may be selectively applied for increasing the dimensions of certain portions of the connection structure for mechanically enhancing the integrity of the electrical connection. A specific illustrative embodiment is disclosed herein. This embodiment relates to the use of piezoelectric coatings on the connection pads of a printed circuit board for improving the electrical connection between the circuit board pads and an exterior connector to which the circuit board is attached for electrical interconnection of the circuits contained on the board with the remaining circuits of the system in which the board is used. However, as a result of the teaching hereinafter disclosed it will be observed that the present invention finds highly advantageous application in virtually any electrical circuit connection device in which a layer of electrostrictive material may be utilized to selectively increase the mechanical dimensions of a connector component to enhance the electrical integrity of the connection.

In the particular embodiment herein disclosed, a layer of piezoelectric material is located under each electrical connection pad of a printed circuit board. The piezoelectric material is electrically isolated from the connected pad itself by a layer of dielectric material such as epoxy resin or Teflon and the like so that application of a voltage to the piezoelectric material to selectively increase the dimensions thereof will not interfere with the electrical parameters of the printed circuit board by way of inadvertent application of piezoelectric voltages to the connection pads. As a result of the presence of a layer of piezoelectric material beneath each electrical connection pad of a printed circuit board, application of a voltage thereto increases the geometrical dimensions of the piezoelectric layer, thereby mechanically forcing the connection pad upwardly in a direction to further compress the connection pad with the interconnecting pin of a suitable electrical connector to which the circuit board is connected for improving the mechanical integrity of the connection and thereby assuring higher reliability for the electrical interconnection therebetween.

OBJECTS OF THE INVENTION

It is therefore a principal object of the present invention of enhancing the interconnection of electrical circuits by utilizing electrostrictive material to which a voltage is selectively supplied for increasing the geometrical dimensions thereof so as to increase the mechanical forces between interconnecting devices such as electrical pins and printed circuit board electrical pads to improve the integrity of the electrical connection therebetween.

It is an additional object of the present invention to provide a printed circuit board in which the electrical connection pads are positioned relative to the layer of electrostrictive material whereby the mechanical integrity of the electrical interconnection between such pads and the interconnecting pins of a connector to which the board is connected may be increased by the application of a voltage to such electrostrictive material.

It is still a further object of the present invention to provide an enhanced circuit connection means utilizing piezoelectric material for increasing the reliability and integrity of the electrical interconnection between two electrical circuits by applying a suitable voltage to the piezoelectric material whenever the circuit to which connection is made is electrically activated.

BRIEF DESCRIPTION OF THE DRAWINGS

The aforementioned objects and advantages of the present invention as well as additional objects and advantages thereof will be more fully understood hereinafter as a result of a detailed description of a preferred embodiment when taken in conjunction with the following drawings in which:

FIG. 1 is a partially broken away three dimensional view of a printed circuit board which employs the present invention;

FIG. 2 is an enlarged view of an electrical pad of the printed circuit board of FIG. 1 showing primarily the region within the dotted line circle of FIG. 1;

FIG. 3 is a top view of the electrical circuit pad of FIG. 2 taken along lines 3—3 of FIG. 2;

FIG. 4 is a top view of the circuit board of FIG. 1 illustrating the interconnection of piezoelectric layers for selective actuation thereof; and FIG. 5 is an enlarged view similar to that of FIG. 2 but illustrating the connection enhancement effects of the present invention in respect to a connector attached to the circuit board pad of FIG. 1.

DETAILED DESCRIPTION OF A PREFERRED EMBODIMENT

Referring first to FIG. 1 it will be seen that the present invention may be advantageously used on a printed circuit board 10 of the type having a dielectric board material 12 on which there is a plurality of selected circuit paths 13 and a plurality of plated apertures 15 to which electrical devices such as resistors, capacitors, transistors and the like (not shown) may be connected. In order to effect connection of the printed circuit board, a typical circuit board 10 includes a plurality of connector pads 14 usually arranged in parallel configuration in proximity to one edge of the board as shown by way of example in FIG. 1.

For purposes of illustrating the present invention a portion of the circuit board 10 of FIG. 1 has been broken away and the configuration of one connector pad 14 is illustrated in an enlarged view in FIG. 2. Referring therefore to FIG. 2 it will be seen that the connector pad 14 of the present invention comprises a conductive layer 16, a non-conductive layer 18, and a piezoelectric layer 20. It will be understood that the vertical dimension of these respective layers has been greatly exaggerated in FIG. 2 for purposes of explanation herein. Furthermore it will be understood that the relative dimensions of each such layer are not dictated by the scale of FIG. 2 but may in fact differ grossly therefrom depending upon the particular application for which the present invention is utilized. Typically, it is contemplated that the vertical scale of the respective layers 16, 18 and 20 of the connector pad 14 shown in FIG. 2 would be on the order of microns and that the lateral dimensions of the various layers and conductors discussed would be on the order of mils., again depending upon the particular application for which the invention is used.

The conductive layer 16 would normally be of a highly conductive material such as copper, gold or solder depending upon the specification of resistance and voltage drop for the overall printed circuit board. It is to be understood that the particular conductive material with which the present invention is used is not limiting of the invention. Furthermore, it is anticipated that the conductive layer would be of conventional design, configuration, material and manufactured in accordance with conventional printed circuit board manufacturing processes. However, in a departure from the prior art technology of printed circuit board manufacture, the present invention adds two additional layers beneath the conductive layer of the printed circuit board connector pads 14. Non-conductive layer 18 is of a high dielectric material, the principal purpose of which is to insulate the conductive layer 16 from the piezoelectric material 20. Non-conductive layer 18 may be made of any suitable high dielectric material such as Kevlar, Teflon, or any suitable resin which would adequately insulate the conductive layer 16 from the piezoelectric layer 20 for a given thickness of non-conductive layer 18.

Piezoelectric layer 20 may be made of any suitable material in which a displacement of charges from their equilibrium position due to electric field polarization alters the mechanical dimensions of the solid, in accordance with the well-known principal of electrostriction. In piezoelectric materials the inverse is also true. More specifically, a mechanical distortion creates a voltage. This inverse effect is caused by permanent dipole moments anchored in the structure without a center of symmetry. Therefore, although piezoelectric materials are especially suitable for the present invention and the particular preferred embodiment herein disclosed contemplates use of such materials, it is to be understood that other materials which only exhibit electrostriction would also be suitable for use herein. Typical piezoelectric materials that may be suitable for use in the present invention comprise asymmetrical crystals such as quartz, tourmaline and rochelle salt. Other materials which may suitable for use in the present invention include ferroelectric materials such as potassium dihydrogen phosphate, potassium sodium tartrate, arsenate and barium titanate. Barium titanate, in particular, may be employed as a single crystal or as rugged ceramic material which can be formed into any shape desired to accommodate the present invention. Other suitable materials and a more general description of the electrostrictive characteristics of such materials, are disclosed in a text entitled "Piezoelectricity" by W. G. Cady, Volumes 1 and 2, Dover Publications, Inc. New York, 1964.

Some of the aforementioned piezoelectric materials undergo permanent parametric changes as a result of heating and cooling through the Curie point which may render them unsuitable for use in the present invention. By way of example, barium titanate may, after the aforementioned heating and cooling, exhibit a permanent piezoelectric response which persists without an external field. Whatever the electrostrictive or piezoelectric material selected it should exhibit a geometrical dimension increase of about 15% minimum at ambient temperature and should preferably be capable of vapor deposition or plating processing to be suitable for use in the present invention.

In the particular embodiment of the invention disclosed herein, a reduced lateral dimension of each of the layers 16, 18 and 20 extends from the connector pads 14 in a direction opposite the edge of the board 12 to provide means for interconnecting the piezoelectric layers 20 to one another and to a source of electrostriction-inducing voltage. In this regard, it is seen in FIG. 3 that the piezoelectric layer 20 is connected to a piezoelectric conductor 22 which first extends along the longitudinal axis of connector pad 14 and then laterally thereto for interconnection with the remaining piezoelectric layers of the other respective connector pads 14 into a common supply voltage such as circuit VCC or a switch for selectively applying the piezoelectric voltage as seen best in FIG. 4. Furthermore, in order to maintain the electric isolation between the piezoelectric layer 20 and the conductive layer 16, the non-conductive layer 18 is connected to a non-conductive insulation path 24 which also extends along the longitudinal axis of connector pad 14 until it extends beyond the lateral piezoelectric conductor 22 as seen best in FIG. 3. In this manner the non-conductive insulation pad 24 assures continuous isolation between the piezoelectric conductor pad 22 and the circuit path 26 which is used in a conventional manner to connect the connector pad 14 to the remaining portions of the printed circuit board circuit.

In operation, the circuit connection enhancement characteristic of the present invention may be carried out in a variety of different ways depending upon the configuration of the interconnecting terminals which mate with connector pads 14 of the printed circuit board 12. One possible configuration is illustrated in FIG. 5 wherein it is shown that a connector 28 employs a connector pin 30 for compressively engaging the top surface of connector pad 14 in a conventional manner. Typically, the integrity of the electrical connection between pin 30 and the top surface of connector pad 14 is dependent upon the mechanical stress exerted by the pin and connector pad relative to one another. In the present invention it will be seen that when an activating voltage is applied to the piezoelectric layer 20 thereby causing the piezoelectric layer to expand its geometrical dimensions including the vertical dimension as seen in FIG. 5, the overall vertical height of the connector pad 14 increases thereby increasing the compressive stress between pad 14 and pin 30 and thus enhancing the connection therebetween.

It will be understood of course that the particular embodiment of the invention shown in the accompanying drawings is not to be considered limitative of the present invention. By way of example, some reduction in structural complexity may be achieved by employing piezoelectric material in connector 28 for compressively increasing the dimensions of pin 30 instead of applying the piezoelectric material on board 12 as shown in FIGS. 1-4. Thus those having skill in the art to which the present invention pertains will now understand that the present invention exploits the novel concept of utilizing piezoelectric material or otherwise electrostrictive material to enhance the mechanical engagement between two electrical conductors for increasing the integrity of the electrical connection therebetween in accordance with a selectively applied voltage which is used to activate the piezoelectric or electrostrictive material suitably placed relative to the electrical connections. Numerous modifications and additions will now be contemplated as a result of applicant's teaching herein. By way of example, the particular embodiment herein disclosed relates specifically to the use of the invention in conjunction with printed circuit boards and connectors adapted for mating thereto. However, the selective improvement in mechanical engagement for enhancing the integrity of electrical connection between two conductive material, clearly has application in a number of other connector configurations as well including, but not limited to, by way of example, plug-type interconnections wherein a tubular-shaped pin may be filled with piezoelectric material and electrically isolated therefrom by a suitable dielectric in a manner similar to that herein disclosed. Accordingly, all such modifications and additions are deemed to be within the scope of the present invention which is to be limited only by the claims appended hereto.

I claim:

1. In a circuit device of the type having electrical circuit paths at least some of which terminate in connector pads for connecting the circuit device to other circuit devices by means of at least one electrical connector, the improvement comprising:

an electrostrictive material intimately associated with each of said connector pads and being adapted for selective connection to a source of electrical voltage for selectively increasing the geometrical dimensions of said electrostrictive material for increasing the mechanical engagement between said connector pads and said electrical connector.

2. The improvement recited in claim 1 wherein said electrostrictive material is a piezoelectric material.

3. The improvement recited in claim 1, wherein said electrostrictive material responds to said source of electrical voltage with an increase in geometrical dimensions of at least 15% beyond nominal dimensions.

4. The improvement recited in claim 1 wherein said electrostrictive material and said connector pads are electrically insulated from each other.

5. The improvement recited in claim 1 wherein said electrostrictive material and said connector pads are separated by a dielectric material.

* * * * *